(12) United States Patent
Gajare et al.

(10) Patent No.: US 11,360,137 B2
(45) Date of Patent: Jun. 14, 2022

(54) PARAMETER FREE IDENTIFICATION OF FAULT LOCATION IN MULTI-TERMINAL POWER TRANSMISSION LINES

(71) Applicant: Hitachi Energy Switzerland AG, Baden (CH)

(72) Inventors: Swaroop Gajare, Bangalore (IN); Obbalareddi Demudu Naidu, Bangalore (IN); Neethu George, Bangalore (IN); Sachin Srivastava, Bangalore (IN); A. V. Sai, Ongole (IN)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 16/957,408

(22) PCT Filed: Oct. 31, 2018

(86) PCT No.: PCT/IB2018/058520
§ 371 (c)(1),
(2) Date: Jun. 24, 2020

(87) PCT Pub. No.: WO2019/130126
PCT Pub. Date: Jul. 4, 2019

(65) Prior Publication Data
US 2020/0348352 A1 Nov. 5, 2020

(30) Foreign Application Priority Data
Dec. 29, 2017 (IN) .............................. 201741047203

(51) Int. Cl.
*G01R 31/08* (2020.01)
*H02J 13/00* (2006.01)
(52) U.S. Cl.
CPC ...... *G01R 31/085* (2013.01); *H02J 13/00002* (2020.01)

(58) Field of Classification Search
CPC .. G01R 31/088; G01R 31/08; G01R 19/2513; G01R 31/086; G01R 31/2836;
(Continued)

(56) References Cited

U.S. PATENT DOCUMENTS

| 4,570,231 A * | 2/1986 | Bunch | G01R 31/088 |
| | | | 324/512 |
| 7,221,166 B2 * | 5/2007 | Saha | G01R 31/088 |
| | | | 324/521 |

(Continued)

FOREIGN PATENT DOCUMENTS

| CN | 102272729 A | 12/2011 |
| CN | 202218000 U | 5/2012 |
| CN | 105223471 A | 1/2016 |

OTHER PUBLICATIONS

Izykowski, Jan, et al., "Accurate Location of Faults on Three-Terminal Line with Use of Three-End Unsynchronised Measurements", 16th PSCC, Glasgow, Scotland, Jul. 14-18, 2008, 8 pages.

(Continued)

*Primary Examiner* — Vinh P Nguyen
(74) *Attorney, Agent, or Firm* — Slater Matsil, LLP

(57) ABSTRACT

A method and device can be used with a power transmission line. Pre-fault voltage and current phasors and during-fault voltage and current phasors for each of first, second, and third terminals are determined based on disturbance records. Using an assumed faulted section, values for a propagation constant of each section, a surge impedance of each section, and a fault location parameter are computed. The computing is based on simultaneously solving pre-fault and during-fault objective functions for the assumed faulted section with the computed pre-fault and during-fault voltage and current phasors. The pre-fault and during-fault objective functions are formulated based on equating junction voltages determined from two of the terminals, conservation of charge at (Continued)

the junction, and equating fault location voltages determined from one terminal and the junction. The values determined for the propagation constant, the surge impedance, and the fault location parameter can be compared with predefined criteria.

22 Claims, 7 Drawing Sheets

(58) Field of Classification Search
CPC ...... G01R 31/083; G01R 31/12; G01R 31/54; G01R 23/16; G01R 31/52; G01R 31/58; G01R 31/66; G01R 19/165; G01R 19/0092; G01R 31/00; G01R 31/50; G01R 29/16; G01R 27/18; G01R 29/18; G01R 31/3275; G01R 31/72; H02H 3/042; H02H 3/083; H02H 7/265; H02H 7/263; H02H 1/0015; H02H 3/00; H02H 3/16; H02H 3/044; H02H 3/38; H02H 1/003; H02H 9/023; H02H 9/02; H02H 7/045; G06F 1/28; G06F 1/266; H02J 13/00; H02J 13/00001; H02J 13/00034; H02J 13/00002; H02J 3/00; H02J 13/0079; H04B 3/46; H04B 2203/5458; H04B 2203/5441; H04B 2203/5495; H04B 10/0791; H04B 3/54
See application file for complete search history.

(56) References Cited

U.S. PATENT DOCUMENTS

| 8,131,485 | B2* | 3/2012 | Balcerek | G01R 31/086 |
| | | | | 702/59 |
| 8,340,931 | B2* | 12/2012 | Dickens | H02J 3/24 |
| | | | | 702/60 |
| 8,525,522 | B2* | 9/2013 | Gong | G01R 31/088 |
| | | | | 324/519 |
| 9,594,112 | B2* | 3/2017 | Schweitzer, III | G01R 31/40 |
| 10,447,030 | B2* | 10/2019 | Naidu | H02H 1/0007 |
| 11,035,891 | B1* | 6/2021 | Schweitzer, III | G01R 21/06 |
| 11,114,843 | B2* | 9/2021 | Naidu | H02H 3/08 |
| 2010/0177450 | A1 | 7/2010 | Holcomb et al. | |
| 2016/0116522 | A1 | 4/2016 | Abido et al. | |

OTHER PUBLICATIONS

Mousavi-Seyedi, Seyed Sina, et al., "Parameter Estimation of Multiterminal Transmission Lines Using Joint PMU and SCADA Data", IEEE Transactions on Power Delivery, vol. 30, No. 3, Jun. 2015, 9 pages.

Rosolowski, E., et al., "Fault Location on Three-terminal Lines Associated with Current Differential Relays", Article in Przeglad Elektrotechniczny, Jan. 2017, ISSN 0033-2097, R. 83 NR Apr. 2007, pp. 119-123.

* cited by examiner

PARAMETER FREE IDENTIFICATION OF FAULT LOCATION IN MULTI-TERMINAL POWER TRANSMISSION LINES

CROSS-REFERENCE TO RELATED APPLICATIONS

This application is a national phase application of International Application No. PCT/IB2018/058520, filed Dec. 31, 2018 which claims priority to Indian Application No. 201741047203, filed Dec. 29, 2017, which applications are hereby incorporated herein by reference.

TECHNICAL FIELD

The present subject matter relates, in general, to identification of fault location in power transmission lines and, in particular, to identification of fault location in multi-terminal power transmission lines.

BACKGROUND

Power transmission lines such as two-terminal, three-terminal power transmission lines etc., are used for bulk power transfer, i.e. for supplying power between loads and one or more power sources. With increased integration of renewable power to the grid, three-terminal/tapped lines are being more commonly used. Using three-terminal/tapped lines saves the costs associated with building substation and installing measurement transformers at tap/junction point. For example, three-terminal/tapped lines are used in cases of solar parks and offshore wind farms where the power evacuation to the main grid is done through a short line that is connected to the main transmission line.

To supply power reliably and protect the transmission lines from thermal loading, fast restoration of outages is very important. For this, accurate identification of fault location (fault location identification) in multi-terminal/tapped lines is required so that a maintenance crew may reach the fault point and undertake the repair quickly. There are numerous fault location identification techniques available for two terminal lines, but accurate fault location identification for three-terminal/tapped lines is challenging as each section of the line has a different length, per unit impedance (X/R ratio), infeed, and charging current. For fault locators with line parameters as input, the accuracy of fault location estimate is affected by the error in input parameters. In addition, accuracy of impedance based fault location identification methods depends on mutual coupling, non-homogeneity of the line and source impedance angles, source to line impedance ratio, fault resistance and fault loop information etc., making fault location identification complicated for multi-terminal/tapped lines.

BRIEF DESCRIPTION OF DRAWINGS

The features, aspects, and advantages of the present subject matter will be better understood with regard to the following description, and accompanying figures. The use of the same reference number in different figures indicates similar or identical features and components.

DETAILED DESCRIPTION

The present subject matter relates to systems and methods for identifying fault location in multi-terminal power transmission lines.

Multi-terminal power transmission lines, such as two-terminal, three-terminal power transmission lines etc., supply power from multiple power sources to loads. A conventional method for identifying fault location in multi-terminal lines uses only selected negative sequence quantities at all terminals. Though the communication requirement between relays is reduced in such methods, the solution does not work for all fault cases. These methods also require the knowledge of source impedance magnitude and angle at all terminals, which might not always be practically available. Another conventional fault location identification method for three terminal lines uses symmetrical components of the voltages and currents measured at the terminals. One limitation of this method is that it requires the fault loop as an input. Also, since it uses zero-sequence quantities to locate the fault, mutual coupling has to be taken into consideration for double-circuit lines. This also causes the solution to fail in cases where the second circuit is open and grounded since there will be no zero sequence current measurements available from un-faulted line. Correct selection of fault location identification subroutine depends on fault resistance, which may not be reliable.

The accuracy of conventional fault location identification methods depends on correct estimation of the line parameters, such as resistance, inductance and capacitance per unit length. These line parameters are difficult to estimate correctly and such estimation depends on many practical conditions such as loading, weather, aging, material property etc. There are a few line parameter estimation methods that require three independent observations/data sets, which may not be available in case of a fault.

In one example, parameter estimation of a three-terminal transmission line may use synchronized measurements from all terminals. In particular, three observations of voltage and current data from all terminals of the line may be used. Such data is available using intelligent electronic devices (IED) data. This data can be recorded by the IEDs at regular intervals and can be analysed for determination of line parameters.

Figure 1:
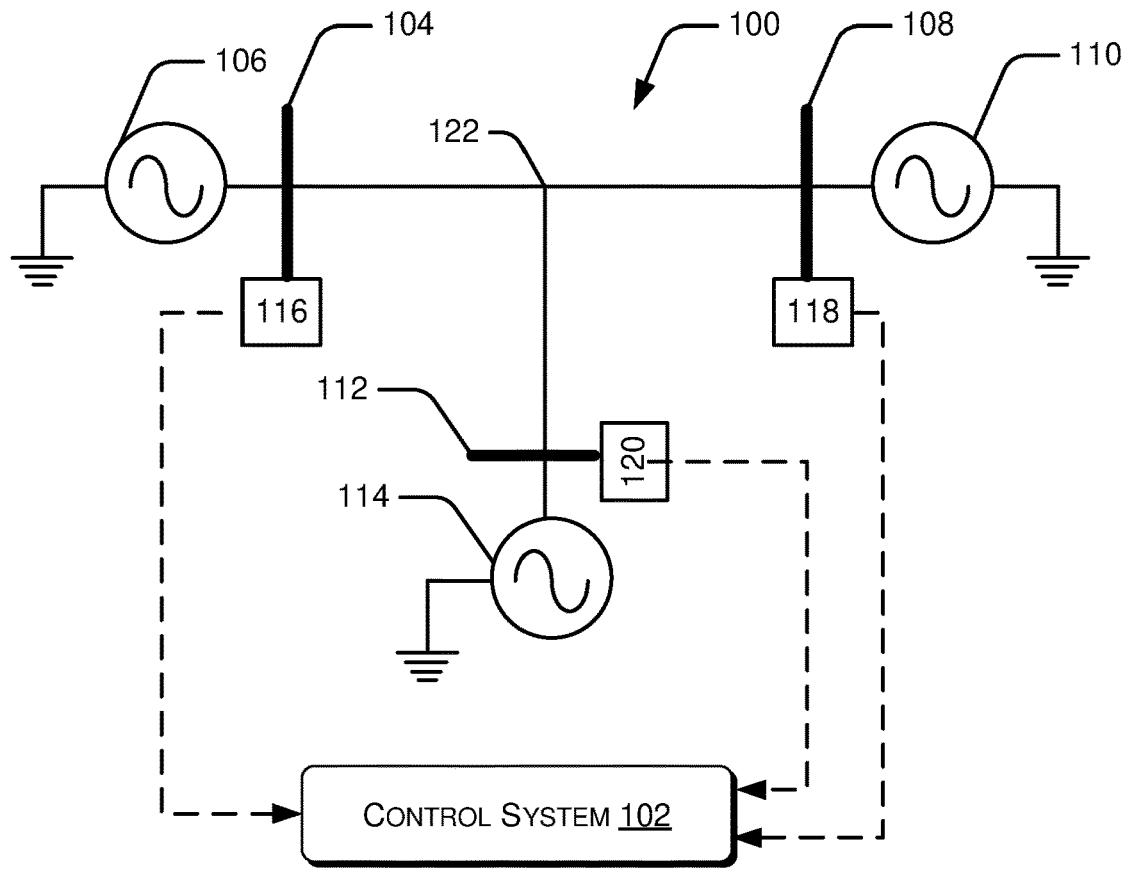
FIG. 1 illustrates an example configuration of a fault free three-terminal power transmission line.

FIG. 1 illustrates an example configuration of a fault free three-terminal power transmission line 100 and a control system 102. The control system 102 may be implemented as any computing device which may be, but is not restricted to, a server, a workstation, a desktop computer, a laptop, and an application. In one example, the control system 102 may be implemented in a cloud network environment.

The power transmission line 100 may be used to transmit electric power. The electric power transmitted may be at high voltages, such as in the range of kilovolts, and for long distances, such as for tens or hundreds of kilometres. The power transmission line 100 includes a first terminal 104 at which the power transmission line 100 receives electric power from a first power source 106. The first power source 106 may be an electric generator in one example, however, in other examples other power sources may be used. It will also be understood that while the following description is provided with reference to power sources connected at the different terminals, in other implementations substations or loads may be connected at one or more of the terminals and all such implementations are also intended to be covered herein.

The first terminal 104 may also be referred to as a first bus 104. The power transmission line 100 also includes a second terminal 108 at which the power transmission line 100 receives electric power from a second power source 110. The second terminal 108 may also be referred to as a second bus 108. The power transmission line 100 further includes a third terminal 112 at which the power transmission line 100 receives electric power from a third power source 114. It will be understood that there would be various other components, such as transformers, power system equipment, etc. present at each terminal, which are not shown or described for brevity.

Each terminal may also be associated with a respective Intelligent Electronic Device (IED). For example, the first terminal 104 may be associated with a first IED 116, the second terminal 108 may be associated with a second IED 118, and the third terminal 112 may be associated with a third IED 120. As will be understood, an IED can be used to record voltage and current and control power system equipment such as a circuit breaker, disconnector, transformer, and the like, at the terminal (or location) at which it is deployed. The components and working of an IED in the context of a power transmission system is readily understood to a person skilled in the art and are hence not described in detail.

Further, as shown in FIG. 1, a junction 122 may be present in the power transmission line between the three terminals 104, 108, 112. Accordingly, a section of the power transmission line between the first terminal 104 and the junction 122 may be referred to as a first section, a section of the power transmission line between the second terminal 108 and the junction 122 may be referred to as a second section, and a section of the power transmission line between the third terminal 112 and the junction 122 may be referred to as a third section.

During operation of the power transmission line 100, the line parameters, such as inductance and capacitance per unit length, may vary with variation in ambient conditions like temperature, aging of the line, etc. To obtain the accurate line parameters, online estimation of line parameters is highly desirable and especially beneficial to fault location and protection applications. In one example, parameter estimation of a three-terminal transmission line may be done using synchronized measurements of voltage and current from all terminals. For example, each of the IED devices 116, 118, and 120 may obtain synchronized voltage and current measurements and provide it to the control system 102. The synchronization of the measurements can be based on synchronization between the IED clocks, or performed at the control system. The control system 102 may then compute the line parameters as discussed below with reference to FIGS. 2 and 3.

Figure 2:
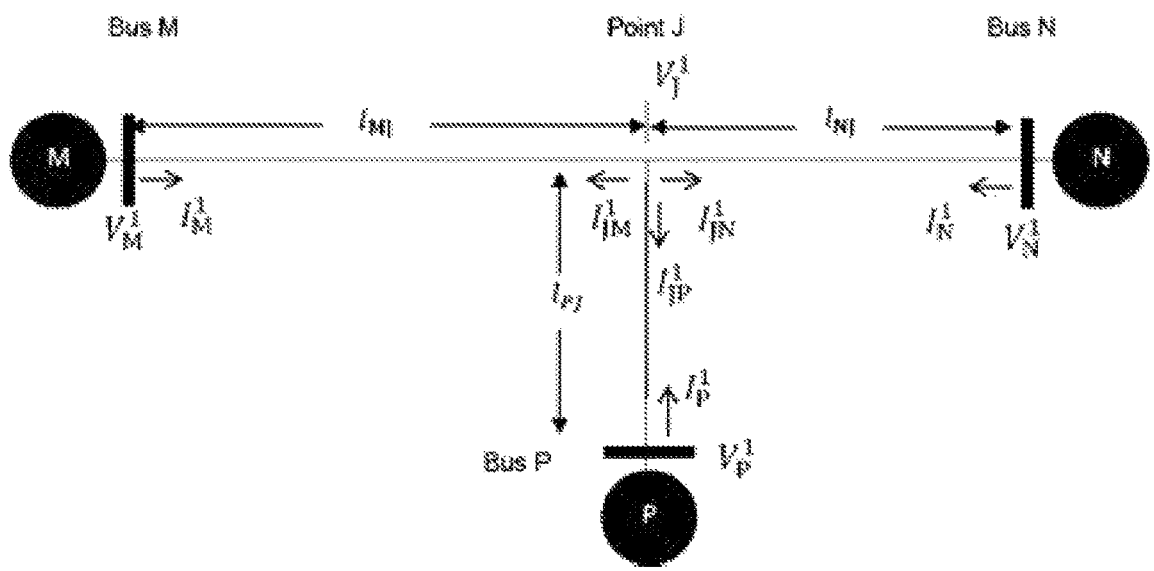
FIG. 2 illustrates current and voltage phasors used for computation of line parameters in a fault free three-terminal power transmission line.

FIG. 2 illustrates current and voltage phasors used for computation of line parameters in a fault free three-terminal power transmission line. Bus M, Bus N and Bus P correspond to the three terminals of the transmission line of sectional lengths $l_{MJ}$, $l_{NJ}$ and $l_{PJ}$. To determine the line parameters, three observations of time synchronized voltage and current data may be received from all terminals. The current and voltage phasors may be then determined and the positive sequence voltages and currents may be obtained.

The positive sequence voltages and currents of the line from bus M may be represented as $V_M^1$, $I_M^1$. The positive sequence voltages and currents from bus N may be represented as $V_N^1$, $I_N^1$. The positive sequence voltages and currents from bus P may be represented as $V_P^1$, $I_P^1$.

Further, voltage and current functions may be formulated for the power transmission line considering the three-terminal power transmission line to be a distributed two-port network model.

Considering the three-terminal line shown in FIG. 2, the voltage at junction J can be obtained using the positive sequence voltage and current from end M in the definition of two-port network P1 as $$V_{J,(M)}^1 = A_{MJ}^1 V_M^1 + B_{MJ}^1 I_M^1 \qquad (1)$$

Where, $A_{MJ}^1$, $B_{MJ}^1$ are the positive sequence ABCD parameters of the line section MJ defined as, $$A_{MJ}^1 = \cos h(\gamma_M l_{MJ});$$

$$B_{MJ}^1 = Z_{cM} \sin h(\gamma_M l_{MJ})$$

where, $l_{MJ}$—length of the line section MJ $Z_{cM}$—positive sequence characteristic impedance of section MJ $\gamma_M$—positive sequence propagation constant of section MJ $V_{J,(M)}^1$—Voltage at junction J calculated using data from end M.

Substituting, the definitions of $A_{MJ}^1$ and $B_{MJ}^1$ in (1), we have $$V_{J,(M)}^1 = \cos h(\gamma_M l_{MJ}) V_M^1 - Z_{cM} \sin h(\gamma_M l_{MJ}) I_M^1 \qquad (2)$$

Similarly, junction voltage can be obtained using the two-port network definition of line section NJ using N end data as, $$V_{J,(N)}^1 = \cos h(\gamma_N l_{NJ}) V_N^1 - Z_{cN} \sin h(\gamma_N l_{NJ}) I_N^1 \qquad (3)$$

Where, $l_{NJ}$—length of the line section NJ $Z_{cN}$—positive sequence characteristic impedance of section NJ $\gamma_N$—positive sequence propagation constant of section NJ $V_{J,(N)}^1$—Voltage at junction J calculated using data from end N.

Similarly, junction voltage can be obtained using the two-port network definition of line section PJ using P end data as, $$V_{J,(P)}^1 = \cos h(\gamma_P l_{PJ}) V_P^1 - Z_{cP} \sin h(\gamma_P l_{PJ}) I_P^1 \qquad (4)$$

Where, $l_{PJ}$—length of the line section PJ $Z_{cP}$—positive sequence characteristic impedance of section PJ $\gamma_P$—positive sequence propagation constant of section PJ $V_{J,(P)}^1$—Voltage at junction J calculated using data from end P.

For a no-fault condition, the voltage of junction J calculated using either end data must be equal. Therefore, for no fault in line, Voltage of node $J$ calculated from Bus $M$ data $(V_{J,(M)}^1)$–Voltage of node $J$ calculated from Bus $N$ data$(V_{J,(N)}^1)=0$ Therefore, using (2) and (3), we define, $$F_1 = \cos h(\gamma_M l_{MJ})V_M^1 - Z_{cM} \sin h(\gamma_M l_{MJ})I_M^1 - \cos h(\gamma_N l_{NJ})V_N^1 + Z_{cN} \sin h(\gamma_N l_{NJ})I_N^1 \quad (5)$$

Similarly,

Voltage of node $J$ calculated from Bus $M$ data $(V_{J,(M)}^1)$–Voltage of node $J$ calculated from Bus $P$ data $(V_{J,(P)}^1)=0$ Therefore, using (2) and (4), we define, $$F_2 = \cos h(\gamma_M l_{MJ})V_M^1 - Z_{cM} \sin h(\gamma_M l_{MJ})I_M^1 - \cos h(\gamma_P l_{PJ})V_P^1 + Z_{cP} \sin h(\gamma_P l_{PJ})I_P^1 \quad (6)$$

The three-terminal power transmission line may be homogenous or non-homogenous. In case of a homogenous power transmission line, the line parameters in all three sections of the power transmission line are considered to be identical. For a three terminal non-homogenous line, two sections of the main line are considered to be identical and the T-section (i.e. section of the other line, from the tap/junction to the terminal) parameters are considered to be different.

The computation of line parameters is discussed below considering a non-homogenous line and is then extended for computation of line parameters for a homogenous line.

In the present example, it is considered that terminal P is connected to main line M-N via tap at junction J. Hence, two sections of the main line corresponding to MJ and NJ are identical and the section corresponding to PJ is not identical to MJ or NJ. For such a non-homogenous line, $\gamma_M = \gamma_N$ and $Z_{cM} = Z_{cN}$. With $\gamma_M = \gamma_N$ and $Z_{cM} = Z_{cN}$, using (5) and (6) for 3 observations of voltage and currents from all the terminals of the line, we have, $$F_{1,1} = \cos h(\gamma_M l_{MJ})V_{M,1}^1 - Z_{cM} \sin h(\gamma_M l_{MJ})I_{M,1}^1 - \cos h(\gamma_M l_{NJ})V_{N,1}^1 + Z_{cM} \sin h(\gamma_M l_{NJ})I_{N,1}^1 \quad (7)$$

$$F_{2,1} = \cos h(\gamma_M l_{MJ})V_{M,1}^1 - Z_{cM} \sin h(\gamma_M l_{MJ})I_{M,1}^1 - \cos h(\gamma_P l_{PJ})V_{P,1}^1 + Z_{cP} \sin h(\gamma_P l_{PJ})I_{P,1}^1 \quad (8)$$

$$F_{1,2} = \cos h(\gamma_M l_{MJ})V_{M,2}^1 - Z_{cM} \sin h(\gamma_M l_{MJ})I_{M,2}^1 - \cos h(\gamma_M l_{NJ})V_{N,2}^1 + Z_{cM} \sin h(\gamma_M l_{NJ})I_{N,2}^1 \quad (9)$$

$$F_{2,2} = \cos h(\gamma_M l_{MJ})V_{M,2}^1 - Z_{cM} \sin h(\gamma_M l_{MJ})I_{M,2}^1 - \cos h(\gamma_P l_{PJ})V_{P,2}^1 + Z_{cP} \sin h(\gamma_P l_{PJ})I_{P,2}^1 \quad (10)$$

$$F_{1,3} = \cos h(\gamma_M l_{MJ})V_{M,3}^1 - Z_{cM} \sin h(\gamma_M l_{MJ})I_{M,3}^1 - \cos h(\gamma_M l_{NJ})V_{N,3}^1 + Z_{cM} \sin h(\gamma_M l_{NJ})I_{N,3}^1 \quad (11)$$

$$F_{2,3} = \cos h(\gamma_M l_{MJ})V_{M,3}^1 - Z_{cM} \sin h(\gamma_M l_{MJ})I_{M,3}^1 - \cos h(\gamma_P l_{PJ})V_{P,3}^1 + Z_{cP} \sin h(\gamma_P l_{PJ})I_{P,3}^1 \quad (12)$$

Where, subscript M, i represents $i^{th}$ data set at bus M and so on.

These equations are of form, $$\begin{bmatrix} F_{1,1} \\ F_{2,1} \\ F_{1,2} \\ F_{2,2} \\ F_{1,3} \\ F_{2,3} \end{bmatrix} = F(\gamma_M, \gamma_P, Z_{cM}, Z_{cP}) = F(x) = 0 \quad (13)$$

Where, $x = (\gamma_M, \gamma_P, Z_{cM}, Z_{cP})$.

The positive sequence voltage and current data can be substituted in the above equations (7) to (12) and the equations can be solved to determine the line parameters, i.e., resistance, inductance, and capacitance, in each section of the power transmission line.

As the above set of equations is of form $F(x)=0$, in one example, they can be solved using Newton-Raphson (NR) method. However, it will be understood that any other numerical analysis technique of solving the equations can also be used and the present subject matter is not limited to solving by NR method. For solving the equations using NR method, the Jacobian matrix of $F(x)$ is defined as, $$\Delta F(x) = J \Delta x \quad (14)$$

where Jacobian J is, $$J = \begin{bmatrix} \frac{\partial F_{1,1}}{\partial \gamma_M} & \frac{\partial F_{1,1}}{\partial \gamma_N} & \frac{\partial F_{1,1}}{\partial Z_{cM}} & \frac{\partial F_{1,1}}{\partial Z_{cP}} \\ \frac{\partial F_{2,1}}{\partial \gamma_M} & \frac{\partial F_{2,1}}{\partial \gamma_N} & \frac{\partial F_{2,1}}{\partial Z_{cM}} & \frac{\partial F_{2,1}}{\partial Z_{cP}} \\ \frac{\partial F_{1,2}}{\partial \gamma_M} & \frac{\partial F_{1,2}}{\partial \gamma_N} & \frac{\partial F_{1,2}}{\partial Z_{cM}} & \frac{\partial F_{1,2}}{\partial Z_{cP}} \\ \frac{\partial F_{2,2}}{\partial \gamma_M} & \frac{\partial F_{2,2}}{\partial \gamma_N} & \frac{\partial F_{2,2}}{\partial Z_{cM}} & \frac{\partial F_{2,2}}{\partial Z_{cP}} \\ \frac{\partial F_{1,3}}{\partial \gamma_M} & \frac{\partial F_{1,3}}{\partial \gamma_N} & \frac{\partial F_{1,3}}{\partial Z_{cM}} & \frac{\partial F_{1,3}}{\partial Z_{cP}} \\ \frac{\partial F_{2,3}}{\partial \gamma_M} & \frac{\partial F_{2,3}}{\partial \gamma_N} & \frac{\partial F_{2,3}}{\partial Z_{cM}} & \frac{\partial F_{2,3}}{\partial Z_{cP}} \end{bmatrix} \quad (15)$$

For n equations and m variables, the Jacobian matrix has n rows and m columns. The first element in J is $$J_{11} = \frac{\partial F_{1,1}}{\partial \gamma_M} \quad (16)$$

The element $J_{11}$ can be obtained using finite differences. Consider a small perturbation of $\delta$ in $\gamma_M$, the differential term $J_{11}$ can be calculated as, $$J_{11} = \frac{\partial F_{1,1}(x_j)}{\partial \gamma_M} = \frac{F_{1,1}(\gamma_M + \delta, \gamma_P, Z_{cM}, Z_{cP}) - F_{1,1}(\gamma_M - \delta, \gamma_P, Z_{cM}, Z_{cP})}{(\gamma_M + \delta) - (\gamma_M - \delta)} \quad (17)$$

Therefore, $$J_{11} = \frac{F_{1,1}(\gamma_M + \delta, \gamma_P, Z_{cM}, Z_{cP}) - F_{1,1}(\gamma_M - \delta, \gamma_P, Z_{cM}, Z_{cP})}{2(\delta)} \quad (18)$$

Using similar finite difference based approach, all the elements in matrix J can be calculated to form the Jacobian matrix defined in (14). The NR method uses an initial guess for variables x and calculates the Jacobian matrix using partial derivatives of the functions with respect to the variables being solved using equation (14) through (20). In every iteration, the NR solver tries to reduce $\Delta F(x)$–the error in function value for the guessed value of x from the actual solution of $F(x)$. The value of x is thus obtained by iteratively solving till $\Delta x \to 0$.

Figure 3:
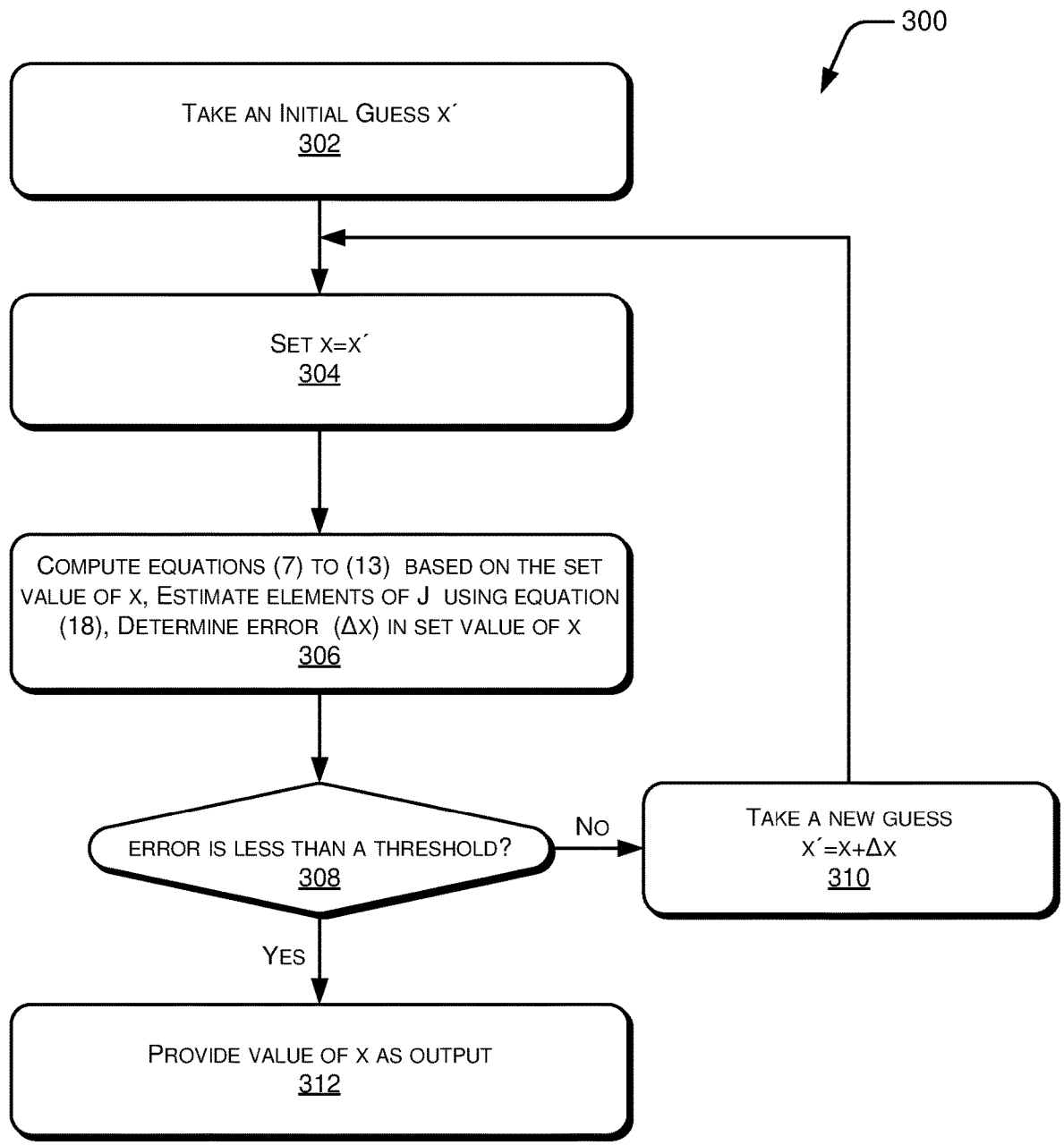
FIG. 3 illustrates a method for determining line parameters from voltage and current functions using Newton Raphson approximation, in accordance with an implementation of the present subject matter.

FIG. 3 illustrates a method 300 for determining line parameters from voltage and current functions using Newton Raphson approximation, in accordance with an implementation of the present subject matter.

At block 302, an initial guess x' is taken. Typically, resistance per meter length of a transmission line is in range 2 to 10 mΩ, inductance per meter length of a transmission line is in range 8 to 15 mH and Capacitance per meter length of a transmission line is in range 8 to 30 nF. Therefore, as an approximation, x' can calculated using R=3 mΩ, L=10 mH and C=10 nF for all line sections for starting the NR method iterations. As will be understood, the method can work for other guess value as well without any significant change in number of iterations or time requirement. However, as the variables $Z_{cM}$ and $Z_{cN}$ have C in the denominator, the term becomes not-determinant for C=0 value. Therefore, with C=0 it is not possible to solve these equations and the method cannot be used for initial guess value as 0.

At block 304, x is set at the guess x', i.e., x=x'.

At block 306, equations (7) to (13) are calculated based on the set value of x and elements of J are estimated using equation (18). Further, error in set value of x, Δx, is computed as, $$\Delta x = J^{-1} \Delta F(x) \quad (19)$$

At block 308, it is determined whether the error is less than a threshold to ensure that Δx→0. In one example, it may be checked if $$\left|\frac{\Delta x}{x}\right| < 10^{-5}$$

At block 310, when the error is not less than the threshold, a new guess x' is computed as $$x' = x + \Delta x \quad (20)$$

The method 300 then returns to block 304, where x is set to the new guess and the process is repeated iteratively till the error is less than the threshold.

At block 312, when the error is less than the threshold, the method 300 provides the final value of x as output.

As discussed above, with reference to equation (13), $$x = (\gamma_M, \gamma_P, Z_{cM}, Z_{cP})$$

Further, it is known that the characteristic impedance $Z_c$ and line propagation constant γ are defined as, $$Z_c = \sqrt{\frac{(R + jwL)}{(jwC)}} \quad (21)$$

$$\gamma = \sqrt{(R + jwL)(jwC)} \quad (22)$$

Where, w is the angular frequency of the system defined using system frequency f as w=2πf.

Rearranging (21) and (22), the line parameters (Resistance R, Inductance L and Capacitance C) can be obtained as:

$$C = \frac{1}{jw}\sqrt{\frac{\gamma}{Z_c}} \quad (22)$$

$$L = \frac{Imag(\sqrt{Z_c \gamma})}{jw} \quad (23)$$

$$R = \text{Real}(\sqrt{Z_c \gamma}) \quad (24)$$

Thus, using the value of x determined above and equations (22) to (24), the line parameters R, L, and C can be computed.

In case of a homogenous line, the parameters of the T-section are same as that of the main line sections, i.e. $\gamma_M = \gamma_N = \gamma_P$ and $Z_{cM} = Z_{cN} = Z_{cP}$. Therefore, the parameters of the line can be obtained by solving for parameters of the main line section only. Thus, using (5) for 3 observations of voltage and currents from all the terminals of the line, we have, $$F_{1,1} = \cos h(\gamma_M l_{MJ}) V_{M,1}^1 - Z_{cM} \sin h(\gamma_M l_{MJ}) I_{M,1}^1 - \cos h(\gamma_M l_{NJ}) V_{N,1}^1 + Z_{cM} \sin h(\gamma_N l_{MJ}) I_{N,1}^1 \quad (26)$$

$$F_{1,2} = \cos h(\gamma_M l_{MJ}) V_{M,2}^1 - Z_{cM} \sin h(\gamma_M l_{MJ}) I_{M,2}^1 - \cos h(\gamma_M l_{NJ}) V_{N,2}^1 + Z_{cM} \sin h(\gamma_N l_{MJ}) I_{N,2}^1 \quad (27)$$

$$F_{1,3} = \cos h(\gamma_M l_{MJ}) V_{M,3}^1 - Z_{cM} \sin h(\gamma_M l_{MJ}) I_{M,3}^1 - \cos h(\gamma_M l_{NJ}) V_{N,3}^1 + Z_{cM} \sin h(\gamma_N l_{MJ}) I_{N,3}^1 \quad (28)$$

Where, subscript M, i represents $i^{th}$ data set at bus M and so on.

Thus, in case of homogenous lines, the equations are of form, $$\begin{bmatrix} F_{1,1} \\ F_{1,2} \\ F_{1,3} \end{bmatrix} = F(\gamma_M, Z_{cM}) = 0 \quad (29)$$

The above set of equations is also of form F(x)=0 and can be solved using Newton-Raphson (NR) method using equations (14) through (20) as discussed for non-homogenous lines above. The line parameters (Resistance R, Inductance L and Capacitance C) can then be obtained from γ and $Z_c$ using the relations (23), (24) and (25) as discussed above.

In one example, the quality of the estimated parameters may be verified using a function norm(F) defined as, $$\text{norm}(F) = \Sigma_{k=1}^{3}(|F_{1,k}|^2 + |F_{2,k}|^2) \quad (30)$$

The estimated parameters can be used to calculate norm(F). Ideally, for no error in parameters and phasors, the value of norm(F) must be zero. But due to some phasor inaccuracy and inaccuracy in determined line parameters (R, L, C and lengths) function may have higher value. However, norm (F)<20 indicates the estimated parameters are close to actual with less than 5% error and hence can be considered to be accurate.

As the above discussed equations used for line parameter estimation use three observations of voltage and current, it is essential that the recorded data sets result in three sets of equations. The above discussed parameter estimation results were found to be good (low error in output parameters) when the three observations had variation in power or current of more than 0.1% of the rated value, thereby resulting in three distinct equations. However, for smaller variations (less than 0.1%) in power/current the error in output values was found to be high as the three sets of equations obtained were not sufficiently distinct. In one example, one of the data set may also be recorded at no-load.

In case of a fault, three sets of data may not be available. Hence, a method using Disturbance recorder (DR) data can be used to formulate the equations for estimation of line parameters and fault location, as discussed below.

The present subject matter relates to systems and methods for identifying fault location in multi-terminal power transmission lines. The systems and methods of the present subject matter can be used for accurately identifying a section of a multi-terminal power transmission line that is having a fault using disturbance recorder data (pre-fault and during-fault information). The systems and methods provide a setting free fault section and fault location identification method for multi-terminal power transmission lines. Thus, line parameter information is not required as an input for faulted section identification/fault location determination. The faulted section identification is based on real and imaginary parts of surge impedance or characteristic impedance as will be discussed below.

The above and other features, aspects, and advantages of the subject matter will be better explained with regard to the following description, appended claims, and accompanying figures. While the following description has been provided using the example of a three-terminal power transmission line, it will be understood that the present subject matter can be implemented for any power transmission system such as multi-terminal/tapped power transmission lines, including for two terminal lines.

Figure 4:
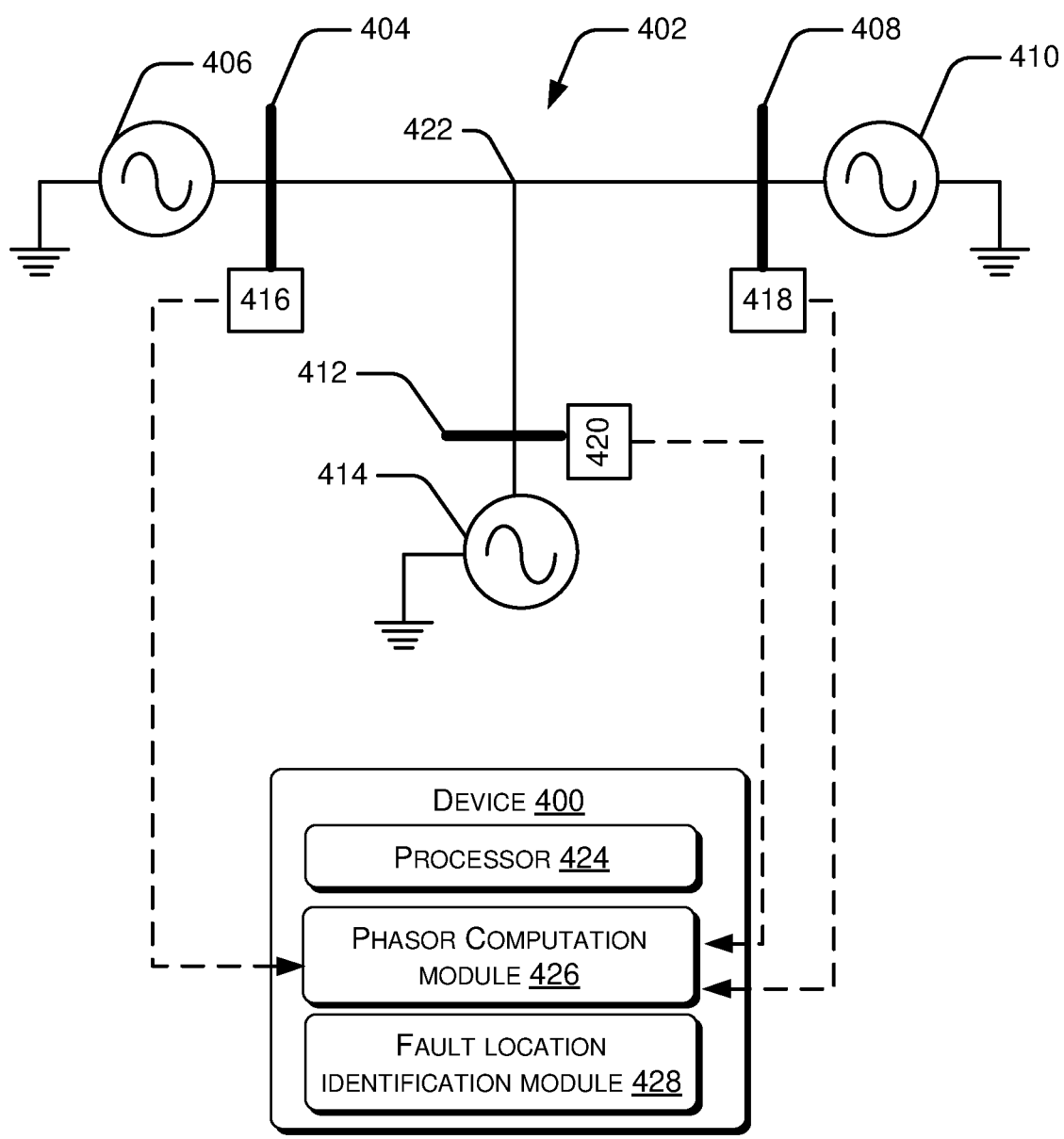
FIG. 4 illustrates a device for identifying a fault location in a multi-terminal power transmission line, in accordance with an implementation of the present subject matter.

FIG. 4 illustrates a device 400 for identifying a fault location in a power transmission line 402, in accordance with an implementation of the present subject matter. The device 400 may be implemented as any computing device which may be, but is not restricted to, a server, a workstation, a desktop computer, a laptop, and an application. In one example, the device 400 may be implemented in a cloud network environment. In one example, the device 400 may be part of a control system, such as the control system 102, or may be implemented separately.

The power transmission line 402 may be used to transmit electric power. The electric power transmitted may be at high voltages, such as in the range of kilovolts, and for long distances, such as for tens or hundreds of kilometres. The power transmission line 402 includes a first terminal 404 at which the power transmission line 402 receives electric power from a first power source 406. The first terminal 404 may also be referred to as a first bus 404. The power transmission line 402 also includes a second terminal 408 at which the power transmission line 402 receives electric power from a second power source 410. The second terminal 408 may also be referred to as a second bus 408. The power transmission line 402 further includes a third terminal 412 at which the power transmission line 402 receives electric power from a third power source 414.

The first, second, and third power sources 406, 410, 414 may be, for example, an electric generator. However, in other examples other power sources may be used. It will also be understood that while the following description is provided with reference to power sources connected at the different terminals, in other implementations substations or loads may be connected at one or more of the terminals and all such implementations are also intended to be covered herein.

Each terminal may also be associated with a respective disturbance recorder or IED. For example, the first terminal 404 may be associated with a first disturbance recorder 416, the second terminal 408 may be associated with a second disturbance recorder 418, and the third terminal 412 may be associated with a third disturbance recorder 420.

As will be understood, a disturbance recorder is a time sequence data recording equipment used to record instantaneous voltage and current at the terminal at which it is deployed. Generally, the disturbance data or records are generated in response to an event, such as in the event of a fault in the power transmission line. In some implementations, the disturbance recorder may be an IED. The components and working of a disturbance recorder would be understood to a person skilled in the art and are not described in detail for brevity.

Further, as shown in FIG. 4, a junction 422 may be present in the power transmission line between the three terminals 404, 408, and 412. Accordingly, a section of the power transmission line between the first terminal 404 and the junction 422 may be referred to as a first section, a section of the power transmission line between the second terminal 408 and the junction 422 may be referred to as a second section, and a section of the power transmission line between the third terminal 412 and the junction 422 may be referred to as a third section.

Sometimes, an electrical fault or disturbance, commonly referred to as a fault, may occur on the power transmission line 402. For example, the fault may occur in any one of the sections in the power transmission line 402. The fault may be, for example, a phase-to-ground fault or a phase-to-phase fault. To facilitate identification of the section having the fault, the device 400 may utilize a processor 424, a phasor computation module 426, and a fault location identification module 428.

The phasor computation module 426, and the fault location identification module 428 may be implemented in hardware, software, or combination of the two. In case the phasor computation module 426 and the fault location identification module 428 are partly or fully implemented in software, the processor 424 can fetch and execute instructions corresponding to the modules. Though not described, it will be understood that the device 400 can include other hardware and software components, such as memory, input/output interfaces, network interfaces, and various programs and applications that can aid in its functioning.

The device 400 is communicatively linked to the disturbance recorders 416, 418, and 420, for example over a wired connection or wireless connection or combination of the two. In one example, the device 400 and the disturbance recorders 416, 418, and 420 communicate with each other over the Internet.

In operation, the phasor computation module 426 may obtain synchronized disturbance records from the disturbance recorders 416, 418, and 420 of the terminals 404, 408, and 412 after a fault has occurred in the power transmission line and compute pre-fault terminal voltage and current phasors and during-fault terminal voltage and current phasors.

The fault location identification module 428 may compute, using an assumed faulted section of the first, second, and third sections, values for propagation constant of each section, surge impedance of each section, and a fault location parameter. In one example, the computing is based on simultaneously solving a plurality of pre-fault objective functions and during-fault objective functions for the assumed faulted section with the computed pre-fault voltage and current phasors, during-fault current and voltage phasors, and line lengths of each section. For example, the pre-fault objective functions and during-fault objective functions may have been formulated based on equating junction voltages determined from two of the terminals, conservation of charge at the junction, and equating fault location voltages determined from one terminal and the junction. In one example, the pre-fault objective functions and during-fault objective functions may be stored in a memory of the device 400.

In one example, each of the pre-fault objective functions and the during-fault objective functions correspond to a function of a set of variables, the function being equal to zero and the set of variables comprising the propagation constant of each section, the surge impedance of each section, and the fault location parameter. In one example, to solve the pre-fault functions and the during-fault functions, the fault location identification module 428 is configured to apply a numerical analysis technique, such as Newton Raphson method, to determine the propagation constant of each section, the surge impedance of each section, and the fault location parameter.

Formulation of the pre-fault objective functions and during-fault objective functions and solving of the objective functions will be discussed later in detail with reference to an example shown in FIGS. 5A-5C.

The fault location identification module 428 may compare the values for propagation constant, surge impedance, and fault location parameter determined for the assumed faulted section with predefined criteria for the section, and determine a faulted section, the fault location, and the line parameters for each of the first, second, and third sections, based on the comparison.

In one example, the predefined criteria used to determine whether a particular assumed section is a faulted section include, (a) the fault location parameter has a value between zero and one; (b) real part of square of propagation constant of each section is less than zero and real part of square of surge impedance of each section is greater than zero; and (c) imaginary part of square of propagation constant of each section is greater than zero and imaginary part of square of surge impedance of each section is less than zero.

Figure 5A:
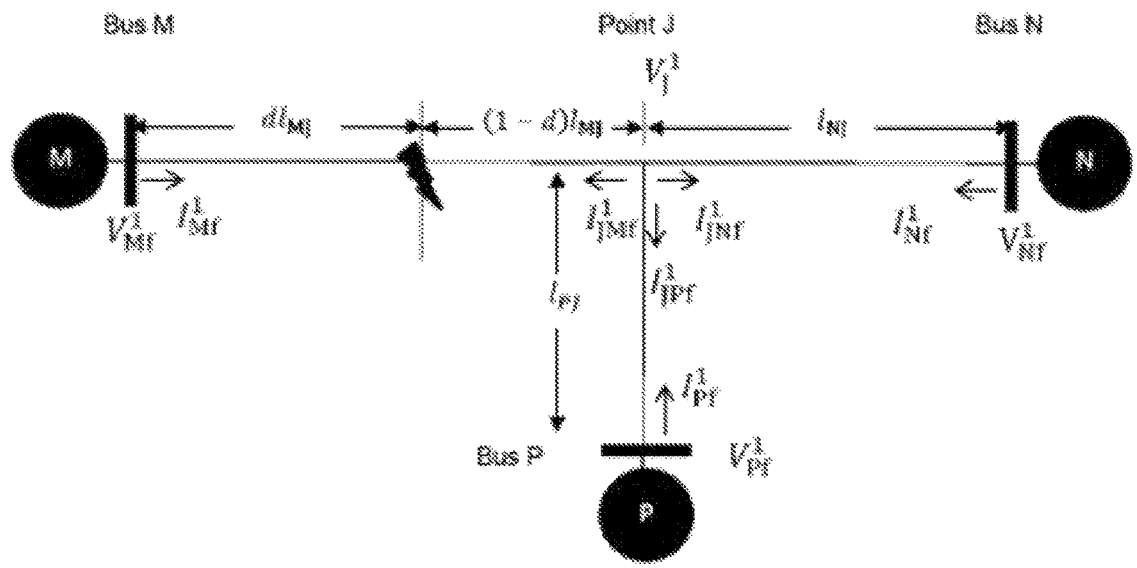
FIGS. 5A-5C illustrate current and voltage phasors used for computation of line parameters and fault location in a three-terminal power transmission line with fault in different sections, in accordance with an implementation of the present subject matter.
Figure 5B:
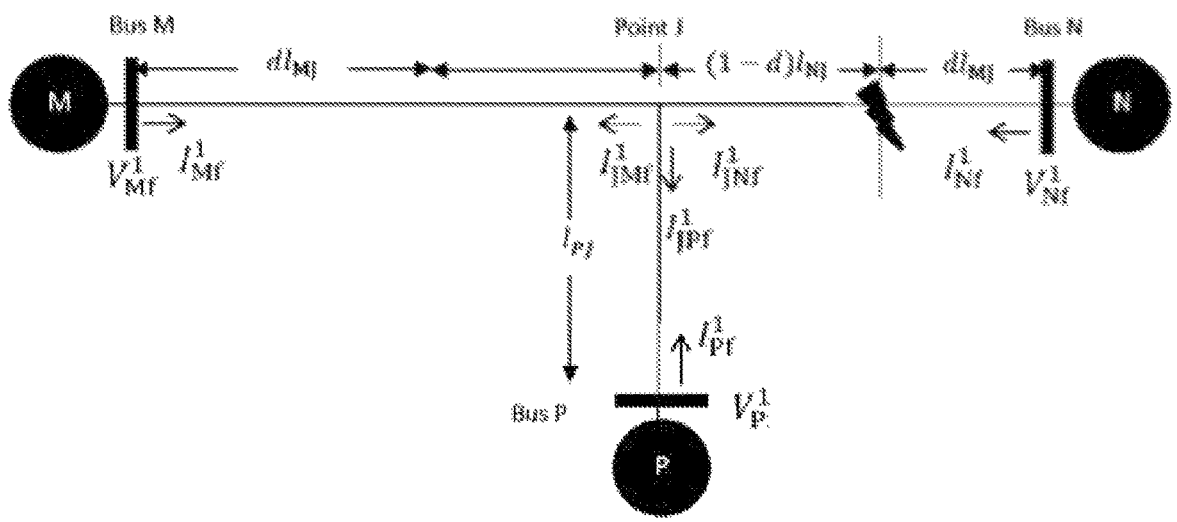
Figure 5C:
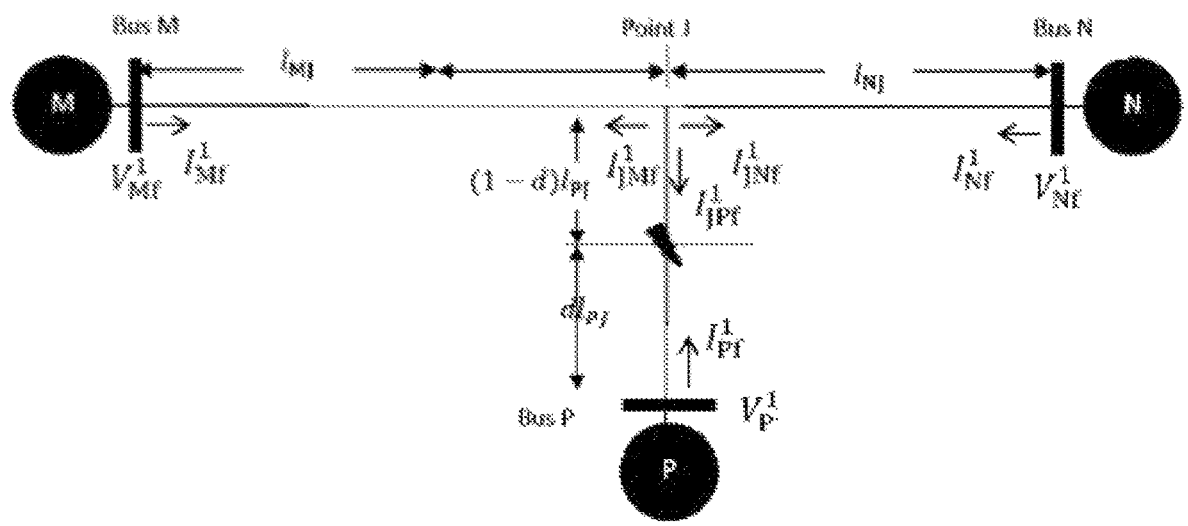

The method of identification of fault location is further described below with reference to FIGS. 5A-5C showing fault location identification on a three-terminal/tapped power transmission line. It will, however, be understood that similar computations can be performed for identification of fault location in any multi-terminal power transmission line, albeit with modifications as will be understood to a person skilled in the art. In the discussion, the objective functions may also be interchangeably referred to as equations.

For a pre-fault condition, the voltage of junction J calculated using either end data must be equal. Therefore, as discussed above, with reference to FIG. 2, considering the three-terminal power transmission line to be a distributed two-port model, the pre-fault objective functions using positive or negative sequence voltage can be formulated as:

$$F_1 = \cos h(\gamma_M l_{MJ})V_M^1 - Z_{cM}\sin h(\gamma_M l_{MJ})I_M^1 - \cos h(\gamma_N l_{NJ})V_N^1 + Z_{cM}\sin h(\gamma_N l_{MJ})I_N^1 \quad (31)$$

$$F_2 = \cos h(\gamma_M l_{MJ})V_M^1 - Z_{cM}\sin h(\gamma_M l_{MJ})I_M^1 - \cos h(\gamma_P l_{PJ})V_P^1 + Z_{cP}\sin h(\gamma_P l_{PJ})I_P^1 \quad (32)$$

$$F_3 = \cos h(\gamma_N l_{NJ})V_N^1 - Z_{cN}\sin h(\gamma_N l_{NJ})I_N^1 - \cos h(\gamma_P l_{PJ})V_P^1 + Z_{cP}\sin h(\gamma_P l_{PJ})I_P^1 \quad (33)$$

Here, $F_1$ has been formulated based on voltage calculated from M and N ends, $F_2$ has been formulated based on voltage calculated from M and P ends, and $F_3$ has been formulated based on voltage calculated from M and P ends. Further, in equations 31-33, $\gamma_M$=propagation constant of section MJ
$\gamma_N$=propagation constant of section NJ
$\gamma_P$=propagation constant of section PJ
$Z_{cM}$=characteristic impedance of section MJ
$Z_{cN}$=characteristic impedance of section NJ
$Z_{cP}$=characteristic impedance of section PJ Also by Kirchhoff's current law (KCL) for conservation of charge at junction 222, for pre-fault condition, the total current flowing out of the junction should be equal to the total current flowing into the junction. Hence, a pre-fault objective function for current can be formulated as $$F_4 = \frac{\sinh(\gamma_M l_{MJ})}{Z_{cM}}V_M^1 - \cosh(\gamma_M l_{MJ})I_M^1 + \frac{\sinh(\gamma_N l_{NJ})}{Z_{cN}}V_N^1 - \cosh(\gamma_N l_{NJ})I_N^1 + \frac{\sinh(\gamma_P l_{PJ})}{Z_{cP}}V_P^1 - \cosh(\gamma_P l_{PJ})I_P^1 \quad (34)$$

The objective functions for during-fault conditions may be formulated assuming the fault location to be in any one of the sections. This will be described with reference to FIG. 5A-5C.

FIGS. 5A-5C illustrate current and voltage phasors used for computation of line parameters and fault location in a three-terminal power transmission line with fault in different sections, in accordance with an implementation of the present subject matter.

As shown in FIG. 5A, consider a fault in section MJ at a distance $dl_{MJ}$ from Bus M and therefore, at a distance $(1-d)l_{MJ}$ from junction point J. Here, d corresponds to fault location parameter and is, in one example, the fraction of length of section MJ from the terminal M at which the fault point is located. It will be understood that the fault location parameter may be defined differently also such as, for e.g., distance from terminal M. The during-fault objective functions can be formulated using two synchronized sets of readings as shown below:

$$F_{5,MJ} = \cosh(\gamma_N l_{NJ})V_{Nf}^1 - Z_{cN}\sinh(\gamma_N l_{NJ})I_{Nf}^1 - \cosh(\gamma_P l_{PJ})V_{Pf}^1 + Z_{cP}\sinh(\gamma_P l_{PJ})I_{Pf}^1$$

$$F_{6,MJ} = \cosh(\gamma_N l_{NJ})V_{Nf}^2 - Z_{cN}\sinh(\gamma_N l_{NJ})I_{Nf}^2 - \cosh(\gamma_P l_{PJ})V_{Pf}^2 + Z_{cP}\sinh(\gamma_P l_{PJ})I_{Pf}^2$$

$$V_{Jf}^1 = \cosh(\gamma_N l_{NJ}) \times V_{Nf}^1 - Z_{cN}\sinh(\gamma_N l_{NJ})I_{Nf}^1$$

$$V_{Jf}^2 = \cosh(\gamma_N l_{NJ}) \times V_{Nf}^2 - Z_{cN}\sinh(\gamma_N l_{NJ})I_{Nf}^2$$

$$I_{JMf}^1 = -\left(\frac{\sinh(\gamma_N l_{NJ})}{Z_{cN}}V_{Nf}^1 - \cosh(\gamma_N l_{NJ})I_{Nf}^1 + \frac{\sinh(\gamma_P l_{PJ})}{Z_{cP}}V_{Pf}^1 - \cosh(\gamma_P l_{PJ})I_{Pf}^1\right)$$

$$F_{5,MJ} = \cosh(\gamma_N l_{NJ})V_{Nf}^1 - Z_{cN}\sinh(\gamma_N l_{NJ})I_{Nf}^1 - \cosh(\gamma_P l_{PJ})V_{Pf}^1 + Z_{cP}\sinh(\gamma_P l_{PJ})I_{Pf}^1$$

$$F_{6,MJ} = \cosh(\gamma_N l_{NJ})V_{Nf}^2 - Z_{cN}\sinh(\gamma_N l_{NJ})I_{Nf}^2 - \cosh(\gamma_P l_{PJ})V_{Pf}^2 + Z_{cP}\sinh(\gamma_P l_{PJ})I_{Pf}^2$$

$$V_{Jf}^1 = \cosh(\gamma_N l_{NJ}) \times V_{Nf}^1 - Z_{cN}\sinh(\gamma_N l_{NJ})I_{Nf}^1$$

$$V_{Jf}^2 = \cosh(\gamma_N l_{NJ}) \times V_{Nf}^2 - Z_{cN}\sinh(\gamma_N l_{NJ})I_{Nf}^2$$

$$I_{JMf}^1 = -\left(\frac{\sinh(\gamma_N l_{NJ})}{Z_{cN}}V_{Nf}^1 - \cosh(\gamma_N l_{NJ})I_{Nf}^1 + \frac{\sinh(\gamma_P l_{PJ})}{Z_{cP}}V_{Pf}^1 - \cosh(\gamma_P l_{PJ})I_{Pf}^1\right)$$

$$I_{JMf}^2 = -\left(\frac{\sinh(\gamma_N l_{NJ})}{Z_{cN}}V_{Nf}^2 - \cosh(\gamma_N l_{NJ})I_{Nf}^2 + \frac{\sinh(\gamma_P l_{PJ})}{Z_{cP}}V_{Pf}^2 - \cosh(\gamma_P l_{PJ})I_{Pf}^2\right)$$

$$F_{7,MJ} = \cosh(\gamma_M dl_{MJ} l_{MJ})V_{Jf}^1 - Z_{cM}\sinh(\gamma_M dl_{MJ} l_{MJ})I_{JMf}^1 - \cosh(\gamma_M(1-dl_{MJ})l_{MJ})V_{Jf}^1 + Z_{cM}\sinh(\gamma_M(1-dl_{MJ})l_{MJ})I_{JMf}^1$$

-continued $$F_{8,MJ} = \cosh(\gamma_M dl_{MJ}l_{MJ})V_{Jf}^2 - Z_{cM}\sinh(\gamma_M dl_{MJ}l_{MJ})I_{JMf}^2 - \cosh(\gamma_M(1-dl_{MJ})l_{MJ})V_{Jf}^2 + Z_{cM}\sinh(\gamma_M(1-dl_{MJ})l_{MJ})I_{JMf}^2$$

Here,

Equations $F_{5,MJ}$ and $F_{6,MJ}$ are based on voltage at junction J computed using a two-port model from the ends where there is no fault, i.e., from N and P terminals.

Equations for current flowing out of junction J into faulted section MJ, i.e., $I_{JMf}^1$ and $I_{JMf}^2$ are determined based on Kirchhoff's current law applied at Junction J.

Equations $F_{7,MJ}$ and $F_{8,MJ}$ are based on voltage at fault location computed using a two-port model from the ends M and J.

where, the superscript i in the during-fault equations shown above indicates the $i^{th}$ data set.

As shown in FIG. 5B, consider a fault in section NJ at a distance $dl_{NJ}$ from Bus N and therefore, at a distance $(1-d)l_{NJ}$ from junction point J. Here, d corresponds to fault location parameter and is, in one example, the fraction of length of section NJ from the terminal N at which the fault point is located. It will be understood that the fault location parameter may be defined differently also. The during-fault objective functions can be formulated using two synchronized sets of readings in a manner similar to that discussed for FIG. 5A. The during-fault objective functions for fault in section NJ are shown below:

$$F_{5,NJ} = \cosh(\gamma_M l_{MJ})V_{Mf}^1 - Z_{cN}\sinh(\gamma_M l_{MJ})I_{Mf}^1 - \cosh(\gamma_P l_{PJ})V_{Pf}^1 + Z_{cP}\sinh(\gamma_P l_{PJ})I_{Pf}^1$$

$$F_{6,NJ} = \cosh(\gamma_M l_{MJ})V_{Mf}^2 - Z_{cN}\sinh(\gamma_M l_{MJ})I_{Mf}^2 - \cosh(\gamma_P l_{PJ})V_{Pf}^2 + Z_{cP}\sinh(\gamma_P l_{PJ})I_{Pf}^2$$

$$V_{Jf}^1 = \cosh(\gamma_M l_{MJ}) \times V_{Mf}^1 - Z_{cN}\sinh(\gamma_M l_{MJ})I_{Mf}^1$$

$$V_{Jf}^2 = \cosh(\gamma_M l_{MJ}) \times V_{Mf}^2 - Z_{cN}\sinh(\gamma_M l_{MJ})I_{Mf}^2$$

$$I_{JNf}^1 = -\left(\frac{\sinh(\gamma_M l_{MJ})}{Z_{cM}}V_{Mf}^1 - \cosh(\gamma_M l_{MJ})I_{Mf}^1 + \frac{\sinh(\gamma_P l_{PJ})}{Z_{cP}}V_{Pf}^1 - \cosh(\gamma_P l_{PJ})I_{Pf}^1\right)$$

$$I_{JNf}^2 = -\left(\frac{\sinh(\gamma_M l_{MJ})}{Z_{cM}}V_{Mf}^2 - \cosh(\gamma_M l_{MJ})I_{Mf}^2 + \frac{\sinh(\gamma_P l_{PJ})}{Z_{cP}}V_{Pf}^2 - \cosh(\gamma_P l_{PJ})I_{Pf}^2\right)$$

$$F_{7,NJ} = \cosh(\gamma_N dl_{NJ}l_{NJ})V_{JNf}^1 - Z_{cN}\sinh(\gamma_N dl_{NJ}l_{NJ})I_{JNf}^1 - \cosh(\gamma_N(1-dl_{NJ})l_{NJ})V_{JNf}^1 + Z_{cN}\sinh(\gamma_N(1-dl_{NJ})l_{NJ})I_{JNf}^1$$

$$F_{8,NJ} = \cosh(\gamma_N dl_{NJ}l_{NJ})V_{JNf}^2 - Z_{cN}\sinh(\gamma_N dl_{NJ}l_{NJ})I_{JNf}^2 - \cosh(\gamma_N(1-dl_{NJ})l_{NJ})V_{JNf}^2 + Z_{cM}\sinh(\gamma_N(1-dl_{NJ})l_{NJ})I_{JNf}^2$$

Here,

Equations $F_{5,NJ}$ and $F_{6,NJ}$ are based on voltage at junction J computed using a two-port model from the ends where there is no fault, i.e., from M and P terminals.

Equations for current flowing out of junction J into faulted section NJ, i.e., $I_{JNf}^1$, $I_{JNf}^2$, are determined based on Kirchhoff's current law applied at Junction J.

Equations $F_{7,NJ}$ and $F_{8,NJ}$ are based on voltage at fault location computed using a two-port model from the ends N and J.

where, the superscript i in the during-fault equations shown above indicates the $i^{th}$ data set.

As shown in FIG. 5C, consider a fault in section PJ at a distance $dl_{PJ}$ from Bus N and therefore, at a distance $(1-d)I_{PJ}$ from junction point J. Here, d corresponds to fault location parameter and is, in one example, the fraction of length of section PJ from the terminal P at which the fault point is located. It will be understood that the fault location parameter may be defined differently also. The during-fault objective functions can be formulated using two synchronized sets of readings in a manner similar to that discussed for FIG. 5A. The during-fault objective functions for fault in section PJ are shown below:

$$F_{5,PJ} = \cosh(\gamma_M l_{MJ})V_{Mf}^1 - Z_{cM}\sinh(\gamma_M l_{MJ})I_{Mf}^1 - \cosh(\gamma_N l_{NJ})V_{Nf}^1 + Z_{cN}\sinh(\gamma_N l_{NJ})I_{Nf}^1$$

$$F_{6,PJ} = \cosh(\gamma_M l_{MJ})V_{Mf}^2 - Z_{cM}\sinh(\gamma_M l_{MJ})I_{Mf}^2 - \cosh(\gamma_N l_{NJ})V_{Nf}^2 + Z_{cN}\sinh(\gamma_N l_{NJ})I_{Nf}^2$$

$$V_{Jf}^1 = \cosh(\gamma_M l_{MJ}) \times V_{Mf}^1 - Z_{cM}\sinh(\gamma_M l_{MJ})I_{Mf}^1$$

$$V_{Jf}^2 = \cosh(\gamma_M l_{MJ}) \times V_{Mf}^2 - Z_{cN}\sinh(\gamma_M l_{MJ})I_{Mf}^2$$

$$I_{JPf}^1 = -\left(\frac{\sinh(\gamma_M l_{MJ})}{Z_{cM}}V_{Mf}^1 - \cosh(\gamma_M l_{MJ})I_{Mf}^1 + \frac{\sinh(\gamma_N l_{NJ})}{Z_{cN}}V_{Nf}^1 - \cosh(\gamma_N l_{NJ})I_{Nf}^1\right)$$

$$I_{JPf}^2 = -\left(\frac{\sinh(\gamma_M l_{MJ})}{Z_{cM}}V_{Mf}^2 - \cosh(\gamma_M l_{MJ})I_{Mf}^2 + \frac{\sinh(\gamma_N l_{NJ})}{Z_{cN}}V_{Nf}^2 - \cosh(\gamma_N l_{NJ})I_{Nf}^2\right)$$

$$F_{7,PJ} = \cosh(\gamma_P dl_{PJ}l_{PJ})V_{JPf}^1 - Z_{cP}\sinh(\gamma_P dl_{PJ}l_{PJ})I_{JPf}^1 - \cosh(\gamma_P(1-dl_{PJ})l_{PJ})V_{JPf}^1 + Z_{cP}\sinh(\gamma_P(1-dl_{PJ})l_{PJ})I_{JPf}^1$$

$$F_{8,PJ} = \cosh(\gamma_P dl_{PJ}l_{PJ})V_{JPf}^2 - Z_{cP}\sinh(\gamma_P dl_{PJ}l_{PJ})I_{JPf}^2 - \cosh(\gamma_P(1-dl_{PJ})l_{PJ})V_{JPf}^2 + Z_{cP}\sinh(\gamma_P(1-dl_{PJ})l_{PJ})I_{JPf}^2$$

Here,

Equations $F_{5,PJ}$ and $F_{6,PJ}$ are based on voltage at junction J computed using a two-port model from the ends where there is no fault, i.e., from M and N terminals.

Equations for current flowing out of junction J into faulted section PJ, i.e., $I_{JPf}^1$ and $I_{JPf}^2$ are determined based on Kirchhoff's current law applied at Junction J.

Equations $F_{7,PJ}$ and $F_{8,PJ}$ are based on voltage at fault location computed using a two-port model from the ends P and J.

where, the superscript i in the during-fault equations shown above indicates the $i^{th}$ data set.

Thus, the during-fault objective functions are formed considering fault in different sections of the line. Then the line parameters and fault location are simultaneously estimated for a set of equations of an assumed faulted section, where the set of equations includes pre-fault objective functions F1 to F4 and during-fault objective functions F5 to F8 corresponding to the assumed faulted section. As can be seen, the equations F1-F8 in a particular set of equations are of the form F(x)=0 and hence can be solved simultaneously using a numerical analysis technique, for example, using the NR method as discussed above, to determine the surge impedance, propagation constants, and fault location parameter d.

Further, the line parameters, i.e., resistance, conductance and inductance of a section can be determined from the surge impedance and propagation constant in that section as discussed earlier. In one example, the line parameters for two of the sections are equal. In another example, the line parameters for all three sections are equal.

The correct line parameters and fault location are selected based on predefine criteria. As is known, for a transmission line with per unit series impedance $z=R+j\omega L$ and per unit shunt admittance $y=j\omega C$ (where, R, L and C indicate the resistance, inductance and capacitance of respective element), the characteristic impedance of the line is defined as, $$Z_c = \sqrt{\frac{z}{y}} = \sqrt{\frac{R+j\omega L}{j\omega C}} = \sqrt{\frac{(R+j\omega L)(-j\omega C)}{\omega^2 C^2}} = \sqrt{\frac{\omega^2 LC}{\omega^2 C^2} - \frac{j\omega RC}{\omega^2 C^2}}$$

Therefore, $$Z_c^2 = \frac{L}{C} - j\frac{R}{\omega C}$$

Also, the propagation constant of the line is defined as, $$\gamma = \sqrt{zy} = \sqrt{(R+j\omega L)(j\omega C)} = \sqrt{-\omega^2 LC + j\omega RC}$$

Therefore, $$\gamma^2 = -\omega^2 LC + j\omega RC.$$

The R, L and C being positive values for a transmission line, Zc and γ should satisfy following characteristic—
a. real($\gamma^2$)<0, and real($Z_c^2$)>0
b. image($\gamma^2$)>0, and imag($Z_c^2$)<0

Hence, when the pre-fault and during-fault equations for a particular section are solved simultaneously, the resulting propagation constant and surge impedance of each section, and fault location parameter should meet the following predefined criteria if that particular section is the faulted section:
(1) The fault location parameter should have a value between 0 and 1, i.e., 0<d<1;
(2) Real part of the square of propagation constant should be less than zero and real part of the square of surge impedance should be greater than zero; and
(3) Imaginary part of the square of propagation constant should be greater than zero and imaginary part of the square of surge impedance should be less than zero Thus, the assumed faulted section for which the predefined criteria are met when the set of equations, including the pre-fault objective functions and the during-fault objective functions for that assumed faulted section, are solved is identified as the faulted section. Accordingly, the fault location and line parameters can be then determined from the fault location parameter, propagation constant, and surge impedance as discussed above.

Figure 6:
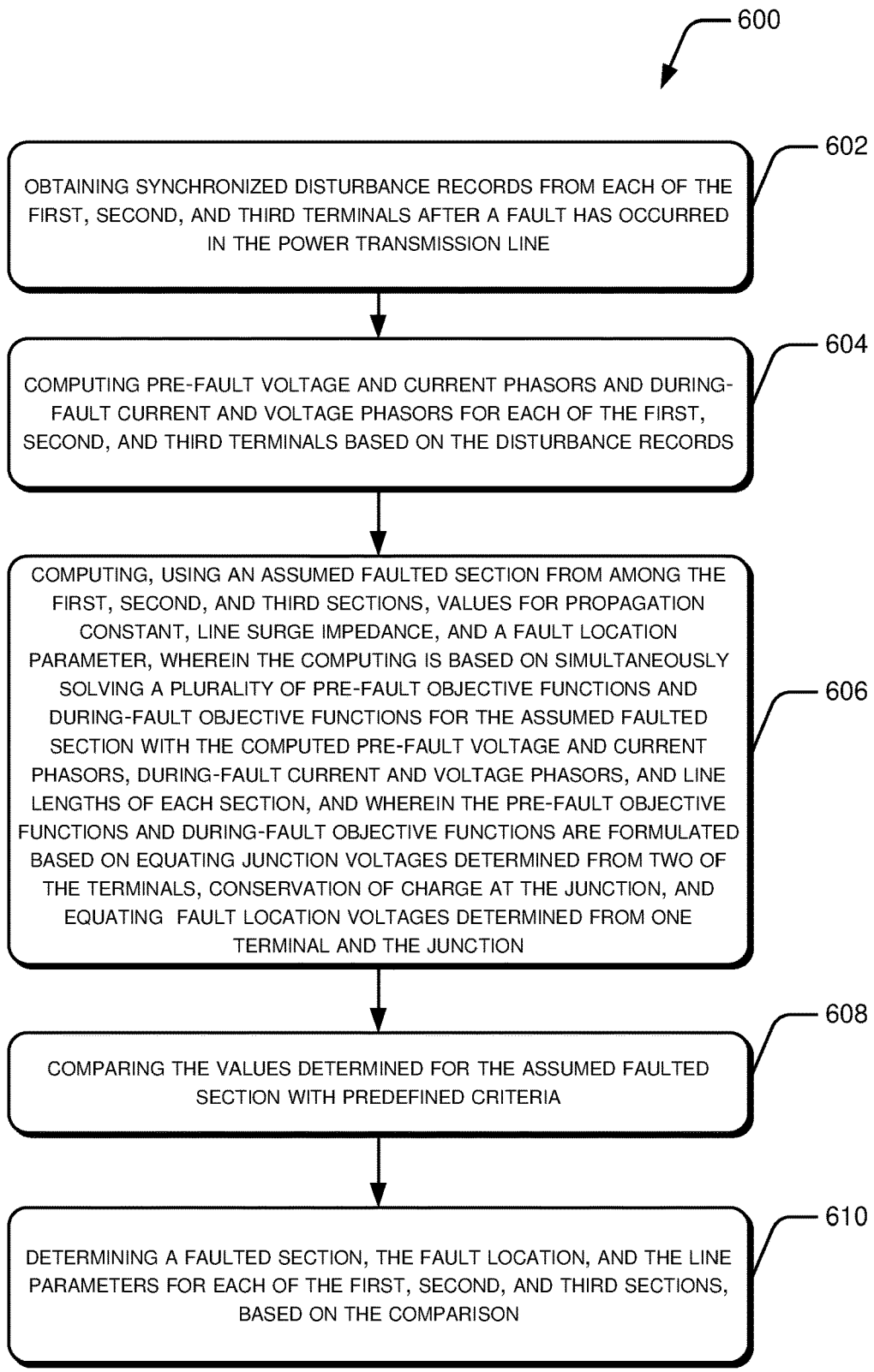
FIG. 6 illustrates a method for identifying a fault location in a multi-terminal power transmission line, in accordance with an implementation of the present subject matter.

FIG. 6 illustrates a method for identifying a fault location in a multi-terminal power transmission line, in accordance with an implementation of the present subject matter. The order in which the method 600 is described is not intended to be construed as a limitation, and any number of the described method blocks may be combined in any order to implement the method 600, or an alternative method. Furthermore, the method 600 may be implemented by processor (s) or computing device(s) through any suitable hardware, non-transitory machine-readable instructions, or a combination thereof.

It may be understood that steps of the method 600 may be performed by programmed computing devices and may be executed based on instructions stored in a non-transitory computer readable medium. Although the method 600 may be implemented in a variety of systems, the method 600 are described in relation to the device 400 and FIGS. 4 and 5A-5C, for ease of explanation. Further, while the method 600 may be implemented for any multi-terminal power transmission line, for discussion purposes, the method 600 is described for a power transmission line having three or more terminals connected at one or more junctions, with at least a first terminal, a second terminal, and a third terminal connected at a junction, wherein a first section connects the first terminal and the junction, a second section connects the second terminal and the junction, and a third section connects the third terminal and the junction.

At step 602, synchronized disturbance records are obtained from each of the first, second, and third terminals after a fault has occurred in the power transmission line.

At step 604, pre-fault voltage and current phasors and during-fault current and voltage phasors are computed for each of the first, second, and third terminals based on the disturbance records At step 606, using an assumed faulted section from among the first, second, and third sections, values for propagation constant for each section, surge impedance for each section, and a fault location parameter are computed. The computation is based on simultaneously solving a plurality of pre-fault objective functions and during-fault objective functions for the assumed faulted section with the computed pre-fault voltage and current phasors, during-fault current and voltage phasors, and line lengths of each section.

As discussed above, the pre-fault objective functions and during-fault objective functions may be formulated based on equating junction voltages determined from two of the terminals, conservation of charge at the junction, and equating fault location voltages determined from one terminal and the junction. For example, each of the pre-fault objective functions and the during-fault objective functions may correspond to a function of a set of variables, the function being equal to zero, wherein the set of variables comprise the propagation constant of each section, the surge impedance of each section, and the fault location parameter.

For example, for a three-terminal power transmission line, the pre-fault objective functions include functions F1 to F4 as discussed above with reference to FIG. 4 and FIGS. 5A-5C and the during-fault functions may correspond to functions F5-F8 as discussed above with reference to FIG. 5A-5C. Thus, the pre-fault objective functions comprise a set of functions based on computation of voltage at the junction from each pair of terminals of the first, second, and third terminals, and a function based on conservation of charge at the junction. Further, the during-fault objective functions for a section comprise a first set of functions based on computation of voltage at the junction from each pair of terminals excluding the terminal of the section, and a second set of functions based on computation of voltage at a fault point from the junction and the terminal of the of the section.

In one example, for simultaneously solving the pre-fault objective functions and the during-fault objective functions, a numerical analysis technique, such as Newton Raphson method, may be applied for determining the propagation constant of each section, the surge impedance of each section, and the fault location parameter.

At step 608, for a particular section assumed to be the faulted section, the values determined for each of the first, second, and third sections are compared with predefined criteria. In one example, the predefined criteria comprise (a) the fault location parameter has a value between zero and one; (b) real part of square of propagation constant of each section is less than zero and real part of square of surge impedance of each section is greater than zero; and (c) imaginary part of square of propagation constant of each section is greater than zero and imaginary part of square of surge impedance of each section is less than zero.

At step 610, a faulted section, the fault location, and the line parameters for each of the first, second, and third sections, are determined based on the comparison. The line parameters may include resistance, conductance, and inductance of each section. In one example, the line parameters for two of the sections may be equal.

Figure 7:
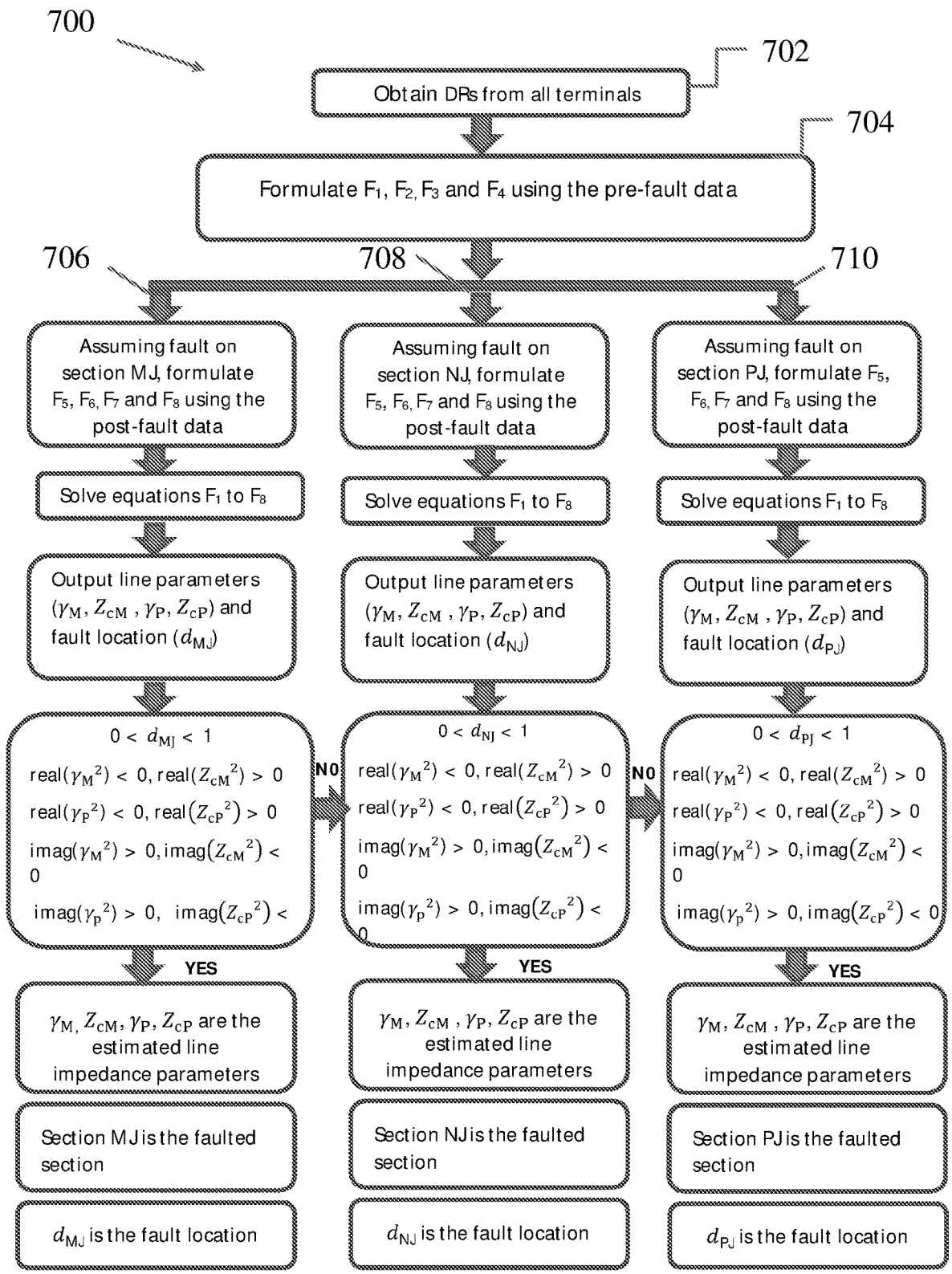
FIG. 7 illustrates a method for identifying a fault location in a multi-terminal power transmission line, in accordance with an implementation of the present subject matter.

In one example, the steps 606-610 may be performed iteratively until the faulted section is identified, for example, as illustrated in FIG. 7. FIG. 7 illustrates a method 700 for identifying a fault location in a multi-terminal power transmission line, in accordance with an implementation of the present subject matter. Like method 600, the method 700 may also be performed by programmed computing devices and may be executed based on instructions stored in a non-transitory computer readable medium. The method 700 is described in relation to the device 400 and FIGS. 4 and 5A-5C for a power transmission line having three or more terminals connected at one or more junctions, for ease of explanation. However, the method 700 can be extended to other implementations also.

As shown, at step 702, the disturbance recorder data is obtained from the terminals, M, N, and P. At step 704, the pre-fault objective functions F1-F4 are formulated as discussed above. Further, the steps corresponding to branches 706, 708, 710 are performed, as shown. For example, at first, the fault may be assumed to be in section MJ and branch 706 may be followed. Accordingly, during-fault objective functions F5-F8 as discussed above with reference to FIG. 5A may be used for determining the fault location. The equations F1-F8 may be solved using a numerical technique to determine the fault location parameter (d) and the propagation constant and surge impedance of each section and the values may be compared to the predefined criteria. In case the predefined criteria are met, the section MJ may be determined to be the faulted section and accordingly, the fault location and line parameters may be determined.

However, if the predefined criteria are not met, a next section may be assumed to be the faulted section. For example, when the predefined criteria are not met, the steps under branch 708 may be carried out assuming section NJ to be the faulted section. Thus, the equations F5-F8 as discussed above with reference to FIG. 5B with section NJ as the assumed faulted section may be used for determining the fault location. Further, the equations F1-F8 may be solved using a numerical technique to determine the fault location parameter (d) and the propagation constant and surge impedance of each section and the values may be compared to the predefined criteria. In case the predefined criteria are met, the section NJ may be determined to be the faulted section and accordingly, the fault location and line parameters may be determined.

However, if the predefined criteria are still not met, a next section may be assumed to be the faulted section. For example, when the predefined criteria are still not met, the steps under branch 710 may be carried out assuming section PJ to be the faulted section. Thus, the equations F5-F8 as discussed above with reference to FIG. 5C with section PJ as the assumed faulted section may be used for determining the fault location. Further, the equations F1-F8 may be solved using a numerical technique to determine the fault location parameter (d) and the propagation constant and surge impedance of each section and the values may be compared to the predefined criteria. In case the predefined criteria are met, the section PJ may be determined to be the faulted section and accordingly, the fault location and line parameters may be determined.

Hence, the methods 600 and 700 provide for a setting free fault location identification, i.e., the fault location can be identified without prior knowledge of the line parameters.

Although the present subject matter has been described with reference to specific implementations, this description is not meant to be construed in a limiting sense. Various modifications of the disclosed implementations, as well as alternate implementations of the subject matter, will become apparent to persons skilled in the art upon reference to the description of the subject matter. Further, although the present subject matter has been explained with reference to specific configurations of a three-terminal power transmission line, it is to be understood that the present subject matter can be used for any power transmission system such as multi-terminal power transmission lines, two terminal transmission lines, mixed power transmission lines etc.

We claim:

1. A method for use with a power transmission line having a first terminal, a second terminal, and a third terminal connected at a junction, wherein a first section connects the first terminal and the junction, a second section connects the second terminal and the junction, and a third section connects the third terminal and the junction, the method comprising:

obtaining synchronized disturbance records from each of the first, second, and third terminals after a fault has occurred in the power transmission line;

computing pre-fault voltage and current phasors and during-fault voltage and current phasors for each of the first, second, and third terminals based on the disturbance records;

using an assumed faulted section from among the first, second, and third sections, computing values for a propagation constant of each section, a surge impedance of each section, and a fault location parameter, wherein the computing is based on simultaneously solving a plurality of pre-fault objective functions and during-fault objective functions for the assumed faulted section with the computed pre-fault voltage and current phasors and during-fault voltage and current phasors, and wherein the pre-fault objective functions and during-fault objective functions are formulated based on equating junction voltages determined from two of the terminals, conservation of charge at the junction, and equating fault location voltages determined from one terminal and the junction; and comparing the values determined for the propagation constant, the surge impedance, and the fault location parameter with predefined criteria.

2. The method as claimed in claim 1, further comprising determining a faulted section, a fault location, and line parameters for each of the first, second, and third sections, based on the comparing.

3. The method as claimed in claim 1, wherein the computing is based on simultaneously solving the plurality of pre-fault objective functions and during-fault objective functions for the assumed faulted section with the computed pre-fault voltage and current phasors, the during-fault voltage and current phasors, and lengths of each section.

4. The method as claimed in claim 1, wherein the assumed faulted section is determined as being the faulted section when the values determined from the pre-fault objective functions and the during-fault objective functions for the assumed faulted section meet the predefined criteria, the predefined criteria comprising:
the fault location parameter has a value between zero and one;
a real part of the square of the propagation constant of each section is less than zero and the real part of the square of the surge impedance of each section is greater than zero; and
an imaginary part of the square of the propagation constant of each section is greater than zero and an imaginary part of the square of the surge impedance of each section is less than zero.

5. The method as claimed in claim 1, wherein two of the sections have the same line parameters.

6. The method as claimed in claim 1, wherein
the pre-fault objective functions comprise a set of pre-fault functions based on computation of voltage at the junction from each pair of terminals of the first, second, and third terminals, and a function based on conservation of charge at the junction; and
the during-fault objective functions for the assumed faulted section comprise a first set of during-fault functions based on computation of voltage at the junction from each pair of terminals excluding the terminal of the assumed faulted section, and a second set of during-fault functions based on computation of voltage at a fault point from the junction and the terminal of the assumed faulted section.

7. The method as claimed in claim 1, wherein each of the pre-fault objective functions and the during-fault objective functions correspond to a function of a set of variables, the function being equal to zero, wherein the set of variables comprise the propagation constant of each section, the surge impedance of each section, and the fault location parameter.

8. The method as claimed in claim 1, wherein simultaneously solving the pre-fault objective functions and the during-fault objective functions comprises applying a numerical analysis technique for determining the propagation constant of each section, the surge impedance of each section, and the fault location parameter.

9. The method as claimed in claim 1, wherein the line parameters include resistance, conductance, and inductance of each section, and wherein the during-fault voltage and current phasors include at least two data sets.

10. A device for identifying a fault location in a power transmission line, the power transmission line having a plurality of terminals connected at one or more junctions, with at least a first terminal, a second terminal, and a third terminal connected at a junction, wherein a first section connects the first terminal and the junction, a second section connects the second terminal and the junction, and a third section connects the third terminal and the junction, the device comprising:
a phasor computation module configured to obtain synchronized disturbance records from each of the plurality of terminals after a fault has occurred in the power transmission line and compute pre-fault terminal voltage and current phasors and during-fault terminal voltage and current phasors; and
a fault location identification module configured to
compute, using an assumed faulted section from among the first, second, and third sections, values for propagation constant of each section, surge impedance of each section, and a fault location parameter, wherein the computation is based on simultaneously solving a plurality of pre-fault objective functions and during-fault objective functions for the assumed faulted section with the computed pre-fault voltage and current phasors, during-fault current and voltage phasors, and line lengths of each section, and wherein the pre-fault objective functions and during-fault objective functions are formulated based on equating junction voltages determined from two of the terminals, conservation of charge at the junction, and equating fault location voltages determined from one terminal and the junction;
compare the values determined for the propagation constant, the surge impedance, and the fault location parameter with predefined criteria; and
determine a faulted section, the fault location, and the parameters for each of the first, second, and third sections, based on the comparison.

11. The device as claimed in claim 10, wherein each of the pre-fault objective functions and the during-fault objective functions correspond to a function of a set of variables, the function being equal to zero, wherein the set of variables comprise the propagation constant of each section, the surge impedance of each section, and the fault location parameter, and wherein to simultaneously solve the pre-fault functions and the during-fault functions, the fault location identification module is configured to apply a numerical analysis technique to determine the propagation constant of each section, the surge impedance of each section, and the fault location parameter.

12. The device as claimed in claim 10, wherein the assumed faulted section is determined as being the faulted section when the values determined from the pre-fault objective functions and the during-fault objective functions for the assumed faulted section meet the predefined criteria, the predefined criteria comprise:
the fault location parameter has a value between zero and one;
a real part of the square of the propagation constant of each section is less than zero and the real part of the square of the surge impedance of each section is greater than zero; and
an imaginary part of the square of the propagation constant of each section is greater than zero and an imaginary part of the square of the surge impedance of each section is less than zero.

13. A device for use with a power transmission line having a first terminal, a second terminal, and a third terminal connected at a junction, wherein a first section connects the first terminal and the junction, a second section connects the second terminal and the junction, and a third section connects the third terminal and the junction, the device comprising:
a processor; and
a non-transitory memory coupled to the processor, the memory storing computer code that, when executed by the processor, causes the processor to:
compute pre-fault voltage and current phasors and during-fault voltage and current phasors for each of the first, second, and third terminals based on synchronized disturbance records obtained from each of the first, second, and third terminals after a fault has occurred in the power transmission line;
compute, using an assumed faulted section from among the first, second, and third sections, values for a propagation constant of each section, a surge impedance of each section, and a fault location parameter, wherein the computation is based on simultaneously solving a plurality of pre-fault objective functions and during-fault objective functions for the assumed faulted section with the computed pre-fault voltage and current phasors and during-fault voltage and current phasors, and wherein the pre-fault objective functions and during-fault objective functions are formulated based on equating junction voltages determined from two of the terminals, conservation of charge at the junction, and equating fault location voltages determined from one terminal and the junction; and compare the values determined for the propagation constant, the surge impedance, and the fault location parameter with predefined criteria.

14. The device as claimed in claim 13, wherein the computer code further causes the processor to determine a faulted section, a fault location, and line parameters for each of the first, second, and third sections, based on the comparison.

15. The device as claimed in claim 14, wherein the line parameters include resistance, conductance, and inductance of each section, and wherein the during-fault voltage and current phasors include at least two data sets.

16. The device as claimed in claim 13, wherein the computer code further causes the processor to compute the propagation constant of each section, the surge impedance of each section, and the fault location parameter by on simultaneously solving the plurality of pre-fault objective functions and during-fault objective functions for the assumed faulted section with the computed pre-fault voltage and current phasors, the during-fault voltage and current phasors, and lengths of each section.

17. The device as claimed in claim 13, wherein the assumed faulted section is determined as being the faulted section when the values determined from the pre-fault objective functions and the during-fault objective functions for the assumed faulted section meet the predefined criteria, the predefined criteria comprising:

the fault location parameter has a value between zero and one;

a real part of the square of the propagation constant of each section is less than zero and the real part of the square of the surge impedance of each section is greater than zero; and an imaginary part of the square of the propagation constant of each section is greater than zero and an imaginary part of the square of the surge impedance of each section is less than zero.

18. The device as claimed in claim 13, wherein the pre-fault objective functions comprise a set pre-fault of functions based on computation of voltage at the junction from each pair of terminals of the first, second, and third terminals, and a function based on conservation of charge at the junction; and the during-fault objective functions for the assumed faulted section comprise a first set of during-fault functions based on computation of voltage at the junction from each pair of terminals excluding the terminal of the assumed faulted section, and a second set of during-fault functions based on computation of voltage at a fault point from the junction and the terminal of the assumed faulted section.

19. The device as claimed in claim 13, wherein each of the pre-fault objective functions and the during-fault objective functions correspond to a function of a set of variables, the function being equal to zero, wherein the set of variables comprise the propagation constant of each section, the surge impedance of each section, and the fault location parameter.

20. The device as claimed in claim 13, wherein the computer code further causes the processor to compute the propagation constant of each section, the surge impedance of each section, and the fault location parameter by on simultaneously solving the pre-fault objective functions and the during-fault objective functions by applying a numerical analysis technique for determining the propagation constant of each section, the surge impedance of each section, and the fault location parameter.

21. A power transmission system comprising:

the device as claimed in claim 13; and a power transmission line having the first terminal, the second terminal, and the third terminal connected at the junction, wherein the first section connects the first terminal and the junction, the second section connects the second terminal and the junction, and the third section connects the third terminal and the junction.

22. The system as claimed in claim 21, wherein two of the sections have the same line parameters.

* * * * *

UNITED STATES PATENT AND TRADEMARK OFFICE
CERTIFICATE OF CORRECTION

PATENT NO. : 11,360,137 B2
APPLICATION NO. : 16/957408
DATED : June 14, 2022
INVENTOR(S) : Gajare et al.

It is certified that error appears in the above-identified patent and that said Letters Patent is hereby corrected as shown below:

In the Claims

Claim 4, Column 19, Line 9; delete "a real part" and insert --the real part--.

Claim 12, Column 20, Line 40; delete "a real part" and insert --the real part--.

Claim 17, Column 21, Line 42; delete "a real part" and insert --the real part--.

Signed and Sealed this
Second Day of August, 2022

Katherine Kelly Vidal
*Director of the United States Patent and Trademark Office*